United States Patent
Luo et al.

(10) Patent No.: US 11,917,865 B2
(45) Date of Patent: *Feb. 27, 2024

(54) DISPLAY PANEL, METHOD FOR FABRICATING THE SAME, AND DISPLAY DEVICE

(71) Applicant: BOE Technology Group Co., Ltd., Beijing (CN)

(72) Inventors: Chengyuan Luo, Beijing (CN); Qing Dai, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 2 days.

This patent is subject to a terminal disclaimer.

(21) Appl. No.: 17/851,123

(22) Filed: Jun. 28, 2022

(65) Prior Publication Data

US 2022/0328584 A1 Oct. 13, 2022

Related U.S. Application Data

(63) Continuation of application No. 16/339,180, filed as application No. PCT/CN2018/102562 on Aug. 27, 2018, now Pat. No. 11,437,448.

(30) Foreign Application Priority Data

Nov. 17, 2017 (CN) .......................... 201711147209.0

(51) Int. Cl.
*H10K 59/122* (2023.01)
*H10K 71/00* (2023.01)
(Continued)

(52) U.S. Cl.
CPC ......... *H10K 59/122* (2023.02); *H10K 59/121* (2023.02); *H10K 71/00* (2023.02); *H10K 59/1201* (2023.02); *H10K 2102/351* (2023.02)

(58) Field of Classification Search
CPC .... H10K 59/122; H10K 59/121; H10K 71/00; H10K 59/1201; H10K 2102/351; H10K 59/173; H10K 71/13; H10K 71/135
See application file for complete search history.

(56) References Cited

U.S. PATENT DOCUMENTS

2007/0132356 A1* 6/2007 Hashimoto .......... H10K 59/122
313/292
2007/0200488 A1* 8/2007 Ito ............................ F21K 2/06
313/503

(Continued)

FOREIGN PATENT DOCUMENTS

CN 102832353 A 12/2012
CN 103484817 A 1/2014

(Continued)

OTHER PUBLICATIONS

Office Action for corresponding Chinese Application No. 201711147209.0 dated Jun. 3, 2020.

(Continued)

*Primary Examiner* — Mohammed Shamsuzzaman
(74) *Attorney, Agent, or Firm* — ArentFox Schiff LLP; Michael Fainberg

(57) ABSTRACT

This disclosure relates to the field of display technologies, and discloses a display substrate, a method for fabricating the same, and a display device. The display substrate includes: a substrate, and a plurality of pixels and a pixel definition layer on the substrate, wherein the pixels include long sides and short sides; and the pixel definition layer includes long-side sections adjacent to the long sides, and short-side sections adjacent to the short sides, wherein heights of the long-side sections are greater than heights of the short-side sections.

6 Claims, 3 Drawing Sheets

(51) Int. Cl.
*H10K 59/121* (2023.01)
*H10K 59/12* (2023.01)
*H10K 102/00* (2023.01)

(56) References Cited

U.S. PATENT DOCUMENTS

| | | | |
|---|---|---|---|
| 2012/0319089 A1 | 12/2012 | Shin et al. | |
| 2013/0337588 A1* | 12/2013 | Lee | H10K 71/166 438/22 |
| 2016/0293683 A1 | 10/2016 | Hou et al. | |
| 2016/0359112 A1* | 12/2016 | Wang | H10K 59/122 |
| 2017/0005149 A1 | 1/2017 | Park et al. | |
| 2017/0104042 A1 | 4/2017 | Wang et al. | |
| 2017/0194395 A1 | 7/2017 | Hu et al. | |
| 2017/0279049 A1 | 9/2017 | Dai | |
| 2018/0138255 A1* | 5/2018 | Lee | H10K 59/1213 |
| 2019/0096970 A1 | 3/2019 | Hou | |
| 2019/0165059 A1 | 5/2019 | Hou | |

FOREIGN PATENT DOCUMENTS

| | | | | |
|---|---|---|---|---|
| CN | 104409647 A | | 3/2015 | |
| CN | 104465671 A | | 3/2015 | |
| CN | 104752490 A | | 7/2015 | |
| CN | 105448957 A | | 3/2016 | |
| CN | 105774279 A | | 7/2016 | |
| CN | 106067478 A | | 11/2016 | |
| CN | 106328675 A | | 1/2017 | |
| CN | 107591432 A | * | 1/2018 | H01L 27/3211 |
| CN | 107591432 A | | 1/2018 | |
| CN | 108010946 A | * | 5/2018 | H01L 27/12 |
| CN | 108010946 A | | 5/2018 | |
| CN | 108074950 A | | 5/2018 | |
| CN | 108110035 A | * | 6/2018 | H01L 27/3246 |
| CN | 108110035 A | | 6/2018 | |

OTHER PUBLICATIONS

Office Action for corresponding Chinese Application No. 201711147209.0 dated Aug. 14, 2020.
Office Action for corresponding Chinese Application No. 201711147209.0 dated Feb. 20, 2021.
Office Action for corresponding Chinese Application No. 201711147209.0 dated May 27, 2021.
ESSR for EP 18859975.7 dated Jul. 2, 2021.
ISR for PCT/CN2018/102562 dated Dec. 5, 2018.
Office Action for corresponding European Application No. 18859975.7 dated Oct. 7, 2022.
Non Final Office Action for U.S. Appl. No. 16/339,180 dated Jan. 6, 2022.
Notice of Allowance for U.S. Appl. No. 16/339,180 dated Aug. 4, 2022.
Restriction Requirement for U.S. Appl. No. 16/339,180 dated Oct. 22, 2022.

* cited by examiner

DISPLAY PANEL, METHOD FOR FABRICATING THE SAME, AND DISPLAY DEVICE

This application is a continuation of U.S. patent application Ser. No. 16/339,180, filed on Aug. 27, 2018, which is a National Stage of International Application No. PCT/CN2018/102562, filed Aug. 27, 2018, which claims the priority of Chinese Patent Application No. 201711147209.0, filed with the Chinese Patent Office on Nov. 17, 2017, and entitled "A display panel, a method for fabricating the same, and a display device", both of which are hereby incorporated by reference in their entireties.

FIELD

The present disclosure relates to the field of display technologies, and particularly to a display panel, a method for fabricating the same, and a display device.

BACKGROUND

An Organic Light-Emitting Diode (OLED) display device has been accepted as a very promising next-generation display technology due to a small thickness, a low weight, a wide angle of view, active light-emission, consecutive adjustability of emitted light color, a low cost, a high response speed, lower power consumption, low driving voltage, a wide operating temperature range, a simple production process, high light emission efficiency, a flexible display, and other advantages.

SUMMARY

At least one embodiment of this disclosure provide a display substrate including: a substrate, and a plurality of pixels and a pixel definition layer on the substrate, wherein:
the plurality of pixels include long sides and short sides; and
the pixel definition layer includes long-side sections adjacent to the long sides, and short-side sections adjacent to the short sides, wherein heights of the long-side sections are greater than heights of the short-side sections.

For example, a length l1 of at least one of the long sides, a length l2 of at least one of the short sides, a height h1 of at least one of the long-side sections, and a height h2 of at least one of the short-side sections satisfy $h1/h2=(1/3 \sim 3/4)l1/l2$.

For example, a height h1 of at least one of the long-side sections ranges from 1 μm to 5 μm, and a height h2 of at least one of the short-side sections ranges from 0.5 μm to 2.5 μm.

For example, wall sides of the pixel definition layer facing the plurality of pixels are slope faces.

For example, each of the slope faces is at a slope angle to the substrate; a slope angle of the slope faces facing the long sides of the plurality of pixels is equal to a slope angle of the slope faces facing the short sides of the plurality of pixels.

For example, the pixel definition layer includes a lyophilic material layer, and a lyophobic material layer located on a side of the lyophilic material layer away from the substrate.

For example, a thickness s1 of the lyophobic material layer, and a thickness s2 of the lyophilic material layer of a long-side section satisfy $s1 \geq 1/2 \ast s2$.

At least one embodiment of this disclosure further provides a display device including the display substrate above.

At least one embodiment of this disclosure further provides a method for fabricating a display substrate, the method including a step of:
forming a pixel definition layer on a substrate, wherein the pixel definition layer includes long-side sections adjacent to long sides of a plurality of pixels, and short-side sections adjacent to short sides of the plurality of pixels, and heights of the long-side sections are greater than the heights of short-side sections.

For example, forming the pixel definition layer on the substrate includes:
forming a thin film of the pixel definition layer on the substrate;
forming a plurality of opening areas on the thin film of the plurality of pixel definition layer, wherein each of the opening areas corresponds to one of the plurality of pixels; and
thinning sections of the thin film of the pixel definition layer, which are adjacent to the shot sides of the pixels.

For example, forming the pixel definition layer on the substrate includes:
forming a thin film of the pixel definition layer on the substrate;
thinning sections of the thin film of the pixel definition layer, which are adjacent to the shot sides of the plurality of pixels; and
forming a plurality of opening areas on the thin film of the pixel definition layer, wherein each of the opening areas corresponds to one of the plurality of pixels.

For example, forming the thin film of the pixel definition layer on the substrate includes:
forming a lyophilic material layer on the substrate; and
forming a lyophobic material layer on a side of the lyophilic material layer away from the substrate.

For example, the method further includes a step of: forming an organic light-emitting layer in the opening areas using solution.

DETAILED DESCRIPTION OF THE EMBODIMENTS

In order to improve the uniformity of the thickness of a film through ink-jet printing in a display substrate so as to improve the display effect of the display device, and to prolong the service lifetime thereof, embodiments of this disclosure provide a display substrate, a method for fabricating the same, and a display device. In order to make the object, the technical solutions, and the advantages of this disclosure more apparent, this disclosure will be described below in further details with reference to the embodiments thereof.

Figure 1:
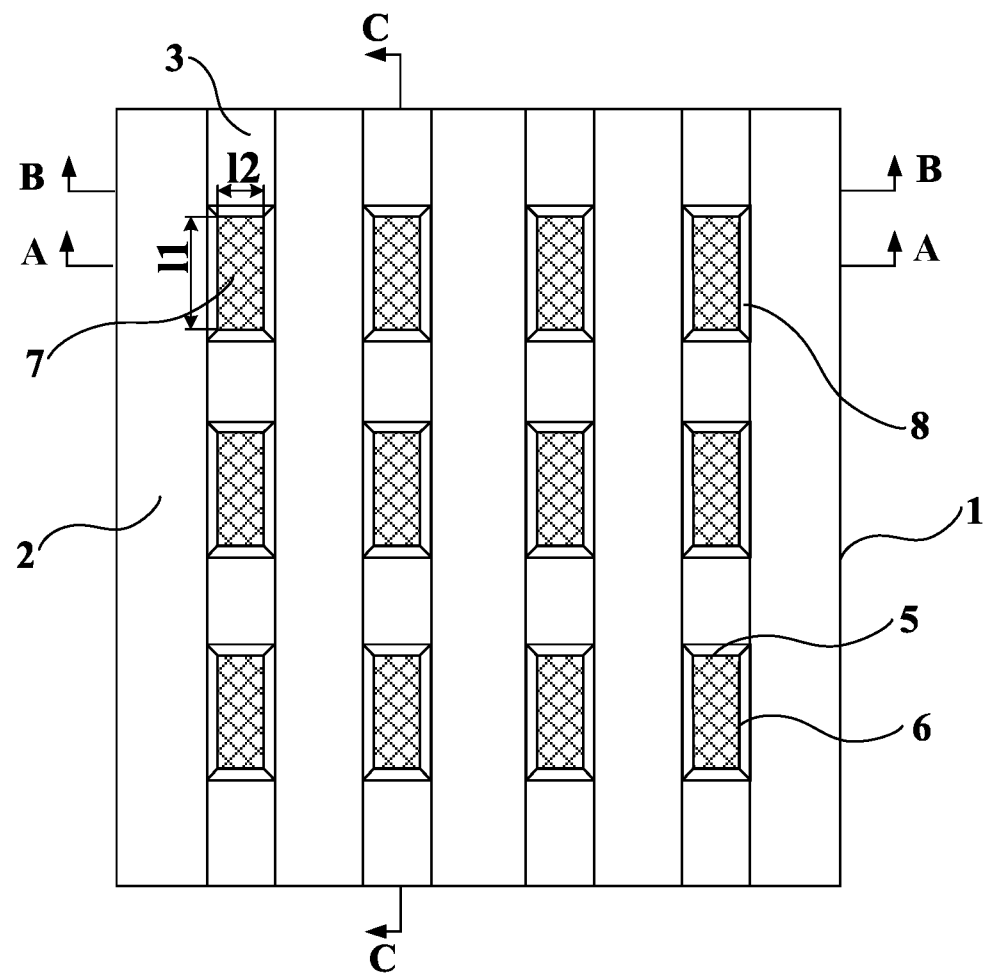
FIG. 1 is a schematic structural diagram of a display substrate according to an embodiment of this disclosure.
Figure 2:
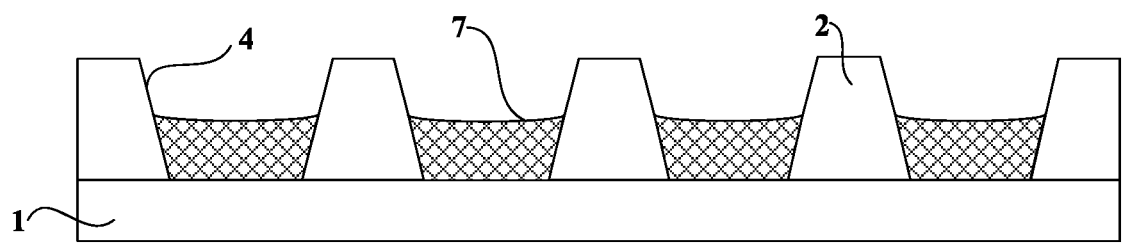
FIG. 2 is a schematic diagram of FIG. 1 in a sectional view along A-A according to the embodiment of this disclosure.
Figure 3:
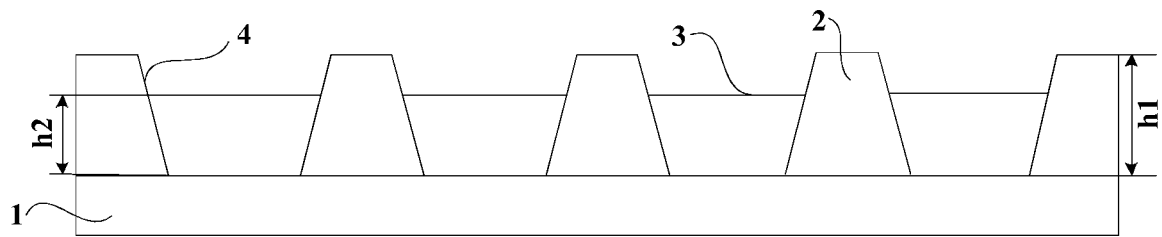
FIG. 3 is a schematic diagram of FIG. 1 in a sectional view along B-B according to the embodiment of this disclosure.
Figure 4:
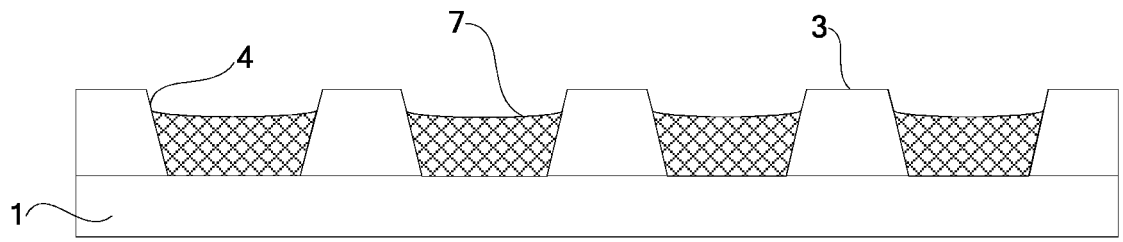
FIG. 4 is a schematic diagram of FIG. 1 in a sectional view along C-C according to the embodiment of this disclosure.

As illustrated in FIG. 1, a display substrate according to an embodiment of the disclosure includes a substrate 1, and a plurality of pixels 7 and a pixel definition layer 8 located on the substrate 1, where:

the pixels 7 include long sides 6 and short sides 5; and
the pixel definition layer 8 includes long-side sections 2 adjacent to the long sides 6, and short-side sections 3 adjacent to the short sides 5, where the heights of the long-side sections 2 are greater than the heights of the short-side sections 3.

The particular type of the display substrate will not be limited, and for example, can be an OLED display substrate or a quantum dot display substrate. The OLED display substrate will be described in this context by way of an example. Since the OLED display substrate includes the pixel definition layer located on the substrate, and the pixels formed in pixel opening areas defined by the pixel definition layer (i.e., areas defined by the long-side sections and the short-side sections of the pixel definition layer), the long-side sections and the short-side sections of the pixel definition layer correspond respectively to the long sides and the short sides of the corresponding pixels.

In a film formation process of the OLED display substrate, a solution process, e.g., the ink-jet printing technology, the screen printing technology, etc., has been accepted as an important technology of large-size and massive printing due to a high utilization ratio of materials thereof. Ink-jet printing will be described in this context by way of an example. In a process of fabricating the OLED display substrate, the heights of the long-side sections 2 of the pixel definition layer 8 are set to be greater than the heights of the short-side sections 3, and after ink-jet printing is finished (that is, an organic light-emitting layer is formed in the opening areas of the pixel definition layer 8 through ink jet printing), the solvent in the ink is removed through vacuum air-pumping, drying, etc., and while the solute in the ink is being dried into a thin film, an air flow in the direction of the long sides 6 of the pixels 7 can flow away quickly, and an air flow in the direction of the short sides 5 of the pixels 7 can flow away slowly, thus cancelling out in effect an influence of a micro-acting force and a moving distance of the ink being dried, and enabling the solvent to be redistributed uniformly in the pixel opening areas, so that a film with a uniform thickness can be formed in the pixel opening areas to thereby improve the display effect of the display device, and prolong the service lifetime of the display device.

Further referring to FIG. 1, in an optional embodiment of this disclosure, the lengths l1 of the long sides 6, the lengths l2 of the short sides 5, the heights h1 of the long-side sections 2, and the heights h2 of the short-side sections 3 satisfy $h1/h2=(1/3\sim3/4)a/b$, where the heights h1 of the long-side sections 2 can range from 1 μm to 5 μm, and the heights h2 of the short-side sections 3 can range from 0.5 μm to 2.5 μm. The particular heights of the long-side sections 2 and the short-side sections 3 of the pixel definition layer 8 will not be limited, and the particular proportional relationship between heights of the long-side sections 2, and the heights of the short-side sections 3 of the pixel definition layer 8, and the lengths of the long sides 6, and the lengths of the short sides 5 of the pixel opening areas will not be limited, and an appropriate proportional relationship can be selected to thereby balance an influence of a micro-acting force and a moving distance of the ink being dried, so as to form a film with a uniform thickness in the pixel opening areas.

As illustrated in FIG. 1 to FIG. 4, in an optional embodiment of this disclosure, the wall side of the pixel definition layer 8 facing the pixels is a slope face 4, and the particular angle of the slope face 4 facing the pixels will not be limited; and optionally, when the slope angle of the slope face 4 of the pixel definition layer 8 facing the long sides 6 of the pixels 7 is equal to the slope angle of the slope 4 thereof facing the short sides 5 of the pixels, an influence upon the thickness of a film to be formed while the ink is being dried, due to different angles of the slopes of the long-side sections 2 and the short-side sections 3 can be alleviated in effect while the film is being formed in the pixel opening areas.

In an optional embodiment of this disclosure, the pixel definition layer 8 can be made of a photosensitive resin organic material, and can be patterned in a photolithograph process.

In an optional embodiment of this disclosure, the pixel definition layer 8 includes a lyophilic material layer, and a lyophobic material layer located on the side of the lyophilic material layer away from the substrate 1, where the thickness s1 of the lyophobic material layer, and the thickness s2 of the lyophilic material layer of a long-side section can satisfy $s1 \geq 1/2*s2$. The pixel definition layer 8 includes a combination of the lyophilic material layer and the lyophobic material layer, and the lyophilic material layer is arranged on the side proximate to the substrate 1, so the ink can be prevented in effect from seriously climbing up the edges of the pixels 7 of the substrate 1 during ink-jet printing to thereby improve the uniformity of the thickness of a film throughout the pixels 7.

Figure 5:
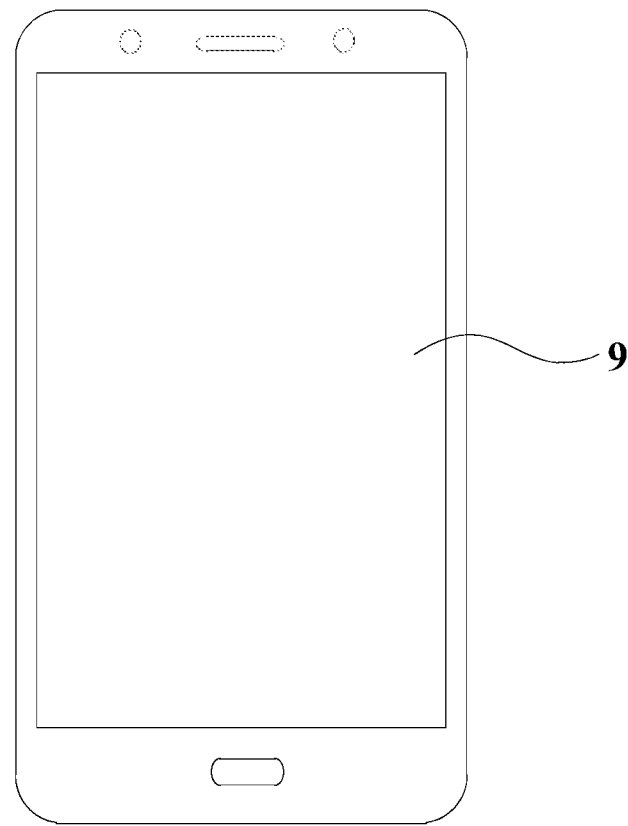
FIG. 5 is a schematic structural diagram of a display device according to an embodiment of this disclosure.

As illustrated in FIG. 5, an embodiment of this disclosure further provides a display device 9 including the display substrate above.

With this solution, a film with a uniform thickness can be formed in the pixel opening areas of the display substrate to thereby improve the quality of a display panel so as to improve in effect the display effect of the display device, and prolong the service lifetime thereof.

The particular type of the display device will not be limited, and for example, can be a mobile phone, a tablet computer, an exhibition screen, an on-vehicle computer, etc.

An embodiment of this disclosure further provides a method for fabricating a display substrate, where the method includes the following steps:

Forming a pixel definition layer on a substrate, where the pixel definition layer includes long-side sections adjacent to long sides of pixels, and short-side sections adjacent to short sides of the pixels, and the heights of the long-side sections are more than the heights of the short-side sections.

Figure 6:
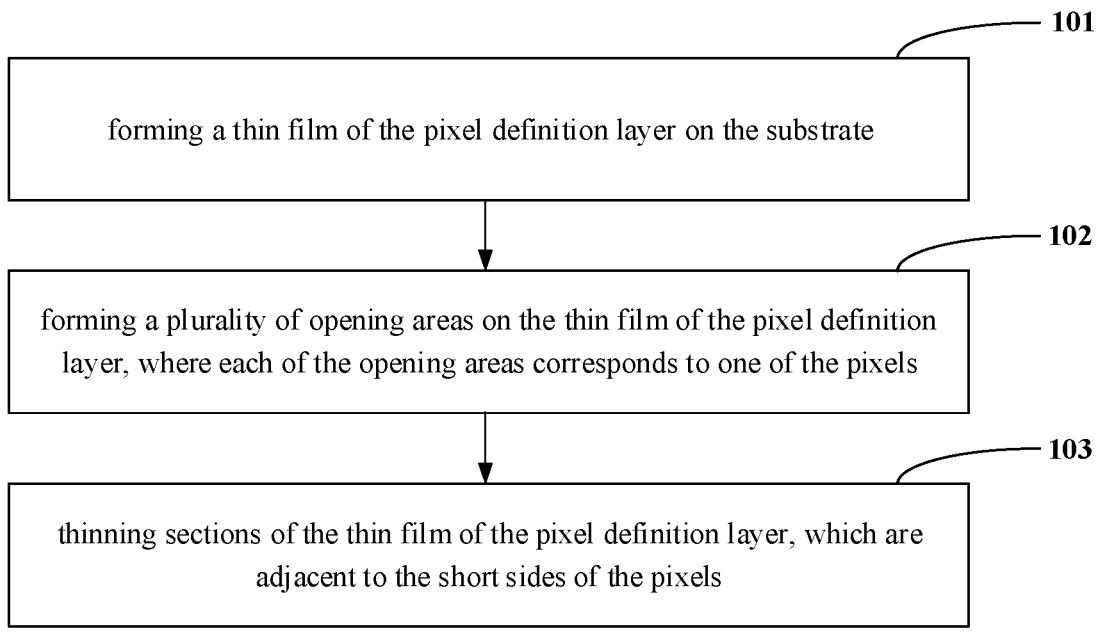
FIG. 6 is a schematic flow chart of a method for fabricating a display substrate according to an embodiment of this disclosure.

As illustrated in FIG. 6, in an optional embodiment of this disclosure, forming the pixel definition layer on the substrate includes:

the step 101 is to form a thin film of the pixel definition layer on the substrate;
the step 102 is to form a plurality of opening areas on the thin film of the pixel definition layer, where each opening area corresponds to one of the pixels; and
the step 103 is to thin sections of the thin film of the pixel definition layer, which are adjacent to the short sides of the pixels.

Figure 7:
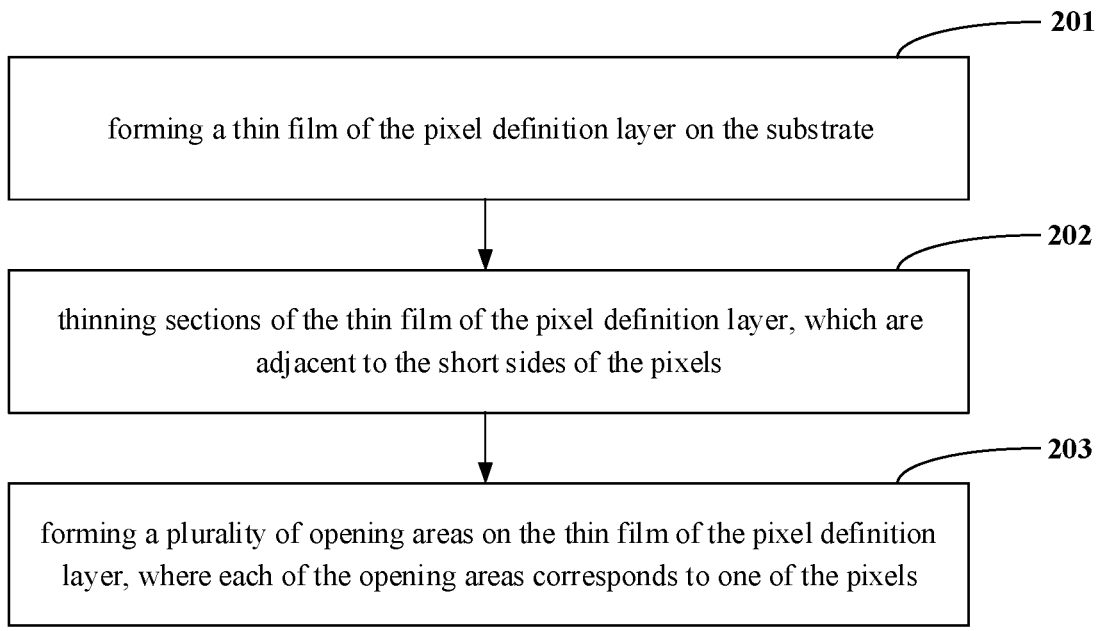
FIG. 7 is a schematic flow chart of a method for fabricating a display substrate according to another embodiment of this disclosure.

As illustrated in FIG. 7, in an optional embodiment of this disclosure, forming the pixel definition layer on the substrate includes:

the step 201 is to form a thin film of the pixel definition layer on the substrate;

the step 202 is to thin sections of the thin film of the pixel definition layer, which are adjacent to the short sides of the pixels; and the step 203 is to form a plurality of opening areas on the thin film of the pixel definition layer, where each opening area corresponds to one of the pixels.

Patterns of respective layers on the substrate are typically fabricated in a patterning process typically including film formation, photo-resist coating, exposure, development, and etching, photo-resist stripping, etc., where a metal layer is typically formed through physical vapor deposition (e.g., magnetically controllable spraying), and patterned through wet etching, and a non-metal layer is typically formed through chemical vapor deposition, and patterned through dry etching.

It shall be noted that the step 102 and the step 103 can be performed in the same patterning process, particularly using a half-tone mask, or the step 102 and the step 103 can be performed in different patterning processes; and alike the step 202 and the step 203 can be performed in the same patterning process, or in different patterning processes.

Optionally, forming the thin film of the pixel definition layer on the substrate in the step 101 or the step 201 includes: forming a lyophilic material layer on the substrate; and forming a lyophobic material layer on the side of the lyophilic material layer away from the substrate.

Optionally, the method for fabricating a display substrate according to the embodiment of this disclosure can further include the step of forming an organic light-emitting layer in the opening areas using solution. For example, the organic light-emitting layer in OLED display elements are formed through ink-jet printing, screen printing, etc., to thereby form the organic light-emitting layer with a uniform thickness.

With the method for fabricating a display substrate according to the embodiment of this disclosure, the heights of the long-side sections of the pixel definition layer are set more than the heights of the short-side sections thereof, and after ink-jet printing is finished, the solvent in the ink can be removed through vacuum air-pumping, drying, etc., and while the solute in the ink is being dried into a thin film, an air flow in the direction of the long sides of the pixels can flow away quickly, and an air flow in the direction of the short sides of the pixels can flow away slowly, thus cancelling out in effect an influence of a micro-acting force and a moving distance of the ink being dried, and enabling the solvent to be redistributed uniformly in the pixel opening areas, so that a film with a uniform thickness can be formed in the pixel opening areas to thereby improve the display effect of the display device, and prolong the service lifetime of the display device.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

What is claimed is:

1. A display substrate, comprising:
a substrate,
a plurality of pixels, and
a pixel definition layer on the substrate, wherein:
the plurality of pixels comprise long sides and short sides formed in pixel opening areas defined by the pixel definition layer;
the pixel definition layer comprises long-side sections adjacent to the long sides, and short-side sections adjacent to the short sides, and heights of the long-side sections are greater than heights of the short-side sections;
a length l1 of at least one of the long sides, a length l2 of at least one of the short sides, a height h1 of at least one of the long-side sections, and a height h2 of at least one of the short-side sections satisfy $h1/h2=(1/3\sim3/4)l1/l2$ to form a film with a uniform thickness in the pixel opening areas; and
the pixel definition layer comprises a lyophilic material layer, and a lyophobic material layer on a side of the lyophilic material layer away from the substrate; a thickness s1 of the lyophobic material layer, and a thickness s2 of the lyophilic material layer of a long-side section satisfy $s1 \geq 1/2 \ast s2$ to improve the uniformity of the thickness of the film in the pixel opening areas.

2. The display substrate according to claim 1, wherein the height h1 of at least one of the long-side sections ranges from 1 μm to 5 μm, and the height h2 of at least one of the short-side sections ranges from 0.5 μm to 2.5 μm.

3. The display substrate according to claim 1, wherein wall sides of the pixel definition layer facing the plurality of pixels are slope faces.

4. The display substrate according to claim 3, wherein each of the slope faces are at a slope angle to the substrate, and none of the slope angle is equal to 90°.

5. The display substrate according to claim 3, wherein a slope angle of the slope facing the long sides of the plurality of pixels is equal to a slope angle of the slope facing the short sides of the plurality of pixels.

6. A display device, comprising the display substrate according to claim 1.

* * * * *